United States Patent [19]

Hufford

[11] Patent Number: 4,547,958

[45] Date of Patent: Oct. 22, 1985

[54] VMJ SOLAR CELL FABRICATION PROCESS USING MASK ALIGNER

[75] Inventor: Diane K. Hufford, Vance AFB, Okla.

[73] Assignee: The United States of America as represented by the Secretary of the Air Force, Washington, D.C.

[21] Appl. No.: 610,911

[22] Filed: May 16, 1984

[51] Int. Cl.[4] ............................................. H01L 31/18
[52] U.S. Cl. ........................................ 29/572; 29/578; 29/583; 430/22; 148/DIG. 102
[58] Field of Search ............... 29/572, 578, 579, 574, 29/580, 583, 760; 136/255; 430/22; 148/DIG. 102, DIG. 115

[56] References Cited

U.S. PATENT DOCUMENTS

| 3,461,566 | 8/1969 | Gerstner | 33/180 |
| 3,615,474 | 10/1971 | Rosenberger | 430/22 |
| 3,685,117 | 8/1972 | Wing et al. | 29/760 |
| 3,963,489 | 6/1976 | Cho | 430/22 |
| 4,330,932 | 5/1982 | Morris et al. | 29/579 |
| 4,377,627 | 3/1983 | Vinton | 430/22 |
| 4,414,749 | 11/1983 | Johannsmeier | 33/180 R |
| 4,418,467 | 12/1983 | Iwai | 29/574 |

*Primary Examiner*—Aaron Weisstuch
*Attorney, Agent, or Firm*—Donald J. Singer; Bobby D. Scearce

[57] ABSTRACT

A novel method and device for accurately aligning a substrate comprising a silicon wafer in the fabrication of a silicon vertical junction solar cell are described which comprise a base plate having a recess therein defining an opening for snugly receiving the wafer, the recess including a substantially straight portion for mating with a cleaved edge of known crystallographic orientation provided on the wafer, and a mask plate for covering the base plate and wafer, the mask including a pattern in predetermined configuration through which the wafer may be exposed in the fabrication process for the solar cell.

1 Claim, 1 Drawing Figure

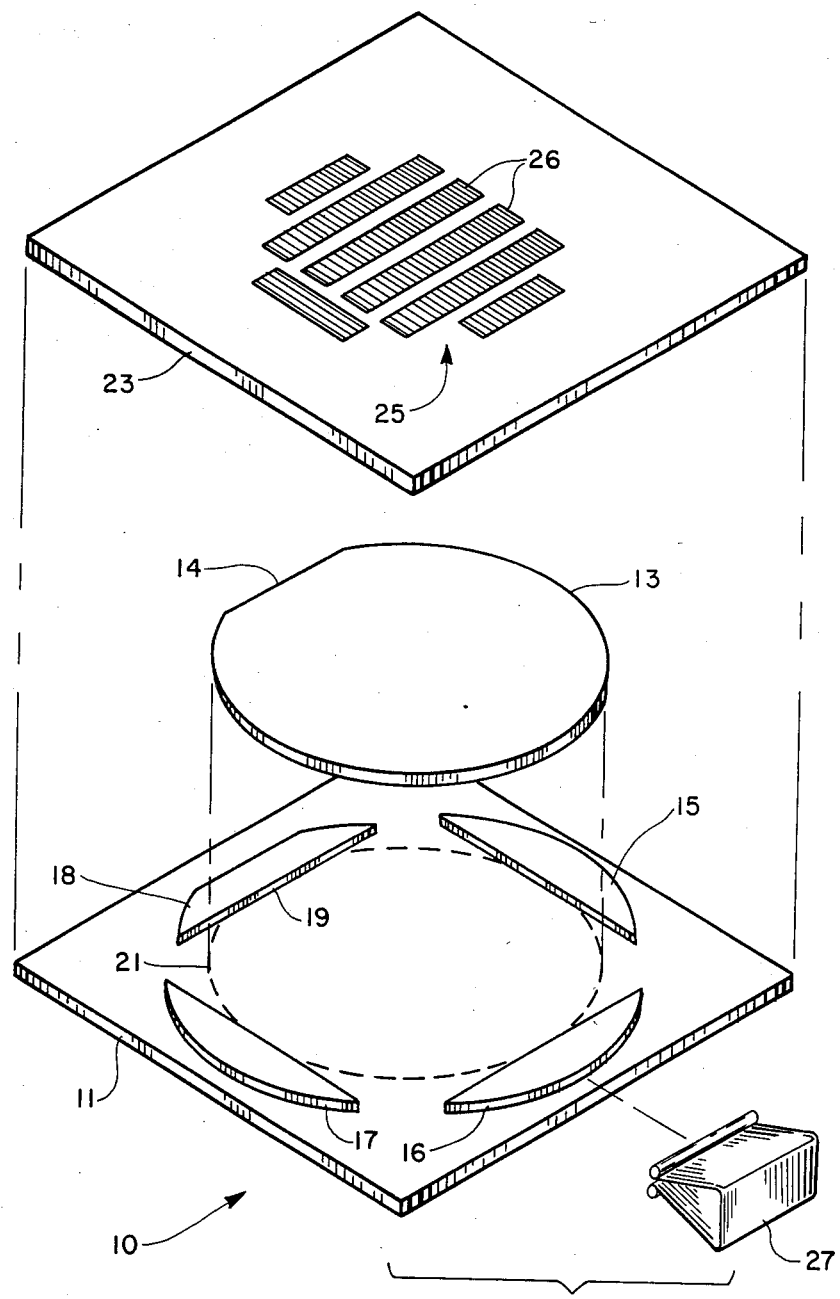

4,547,958

VMJ SOLAR CELL FABRICATION PROCESS USING MASK ALIGNER

RIGHTS OF THE GOVERNMENT

The invention described herein may be manufactured and used by or for the Government of the United States for all governmental purposes without the payment of any royalty.

BACKGROUND OF THE INVENTION

This invention relates generally to the field of solar cells, and more particularly to a novel alignment device and method for accurately aligning silicon wafers in the fabrication of silicon vertical junction solar cells.

The basic structure and operation of solar cells is well known, and the utilization of silicon solar cells for the generation of electricity for remote marine, terrestrial, and satellite applications is well documented. The development of the vertical junction solar cell answered the need for a radiation resistant cell having improved electrical conversion efficiency for operation in an ionizing radiation environment to which the cell may be subjected in extra-terrestrial applications. The state of the art relating to vertical junction solar cells may be exemplified by solar cell configurations disclosed by or referenced in U.S. Pat. No. 3,690,953 titled "Vertical Junction Hardened Solar Cell", U.S. Pat. No. 3,985,579 titled "Rib and Channel Vertical Multijunction Solar Cell", U.S. Pat. No. 4,409,423 titled "Hole Matrix Vertical Junction Solar Cell", and U.S. Pat. No. 4,420,650 titled "Wedged Channel Vertical Junction Silicon Solar Cell".

Vertical junction solar cell structures known in the prior art may comprise a variety of configurations defining the vertical junctions of the solar cells. One such configuration includes a plurality of narrow grooves or channels etched into the surface of a semiconductor substrate, the channels providing the areas upon which the photovoltaic junction of the cell is diffused, the narrow ribs of the structure which define the channels providing the vertical junctions for the cell. Another configuration includes a silicon chip having in one surface a plurality of short, wedge shaped channels closely spaced in an array and separated by thin vertical ribs, the photovoltaic junction being diffused over the rib surfaces and chip surfaces between the ribs. Another cell configuration includes a silicon chip having in one surface a plurality of holes closely spaced in an array, the vertical junction areas being provided on the walls defining the holes.

Common to all the known vertical junction cell configurations with the exception of the hole matrix configuration is a fabrication constraint that the vertical junctions of the cell be accurately aligned relative to certain predetermined crystallographic planes of the semiconductor material comprising the solar cell. For example, in the fabrication of one channelled silicon vertical junction cell configuration, the cell is fabricated from a wafer having surfaces parallel to the (110) crystallographic planes and the channels aligned along (111) planes. It is therefore critical to the successful fabrication of such cells that the substrate be accurately aligned and held in the required predetermined position.

The present invention provides a novel device for aligning a mask over a silicon wafer, and method for fabricating a vertical junction solar cell wherein the mask is accurately aligned along a specified crystallographic orientation of the silicon.

It is therefore a principal object of the present invention to provide an improved device for aligning a silicon wafer for solar cell fabrication.

It is another object of the present invention to provide an improved method for aligning a silicon wafer in the fabrication of vertical junction silicon solar cells.

It is a further object of the present invention to provide an improved silicon solar cell fabrication method.

These and other objects of the present invention will become apparent as the detailed description of certain representative embodiments thereof proceeds.

SUMMARY OF THE INVENTION

In accordance with the foregoing principles and objects of the present invention, a novel method and device for accurately aligning a substrate comprising a silicon wafer in the fabrication of a silicon vertical junction solar cell are described which comprise a base plate having a recess therein defining an opening for snugly receiving the wafer, the recess including a substantially straight portion for mating with a cleaved edge of known crystallographic orientation provided on the wafer, and a mask plate for covering the base plate and wafer, the mask including a pattern in predetermined configuration through which the wafer may be exposed in the fabrication process for the solar cell.

DESCRIPTION OF THE DRAWINGS

The present invention will be more clearly understood from the following detailed description of representative embodiments thereof read in conjunction with the accompanying drawing which presents an exploded view to scale of the mask and base/guide plate of the present invention.

DETAILED DESCRIPTION

Referring now to the accompanying drawing, shown therein is an exploded view of the mask aligner 10 of the present invention. A thin, substantially rigid base or guide plate 11 is used to directly support a silicon chip or wafer 13 used as a substrate in solar cell fabrication. In the unit built in demonstration of the invention herein, base plate 11 comprised a glass plate about three inches square, although other materials may comprise the plate and, therefore, size and material of construction for base plate 11 is not limiting of these teachings. Four pieces of silicon wafer 15, 16, 17, 18 were glued to base plate 11 in a predetermined arrangement as suggested in the drawing to provide a guide for automatic alignment of wafer 13. Pieces 15, 16, 17 were arranged to define a recess of configuration substantially as defined by dashed outline 21 and of size to snugly receive wafer 13. In the demonstration device to as depicted in the drawing, wafer 13 was about 2 inches in diameter and about 0.012 inch thick. Wafer pieces 15–18 and recess 21 were sized accordingly. Wafer piece 18 was provided with a flat edge 19 which comprises a reference alignment edge for precise alignment of wafer 13 within aligner 10 as hereinafter described.

For the demonstration device 10, silicon wafer alignment pieces 15–18 were selected to provide the positioning guide for silicon wafer 13 because of their availability and suitable thickness. Pieces 15–18 were selected to have thicknesses slightly (a few mils) less than wafer 13. This configuration provided a uniform thickness of the assembly including base plate 11, wafer 13 and mask plate 23, and provided good contact between mask 23 and wafer 13 thereby allowing uniform and sharply resolved exposure of wafer 13 according to the procedure hereinafter detailed. It is understood that the base plate 11 and wafer pieces 15-18 assembly may comprise other materials of construction and may be configured alternatively, such as a single plate unit with a recess of appropriate depth and diameter machined into the surface thereof, within the scope of these teachings.

Mask plate 23 comprised a glass plate and included the mask pattern 25 corresponding to the desired predetermined lined pattern 26 for providing the channels comprising the vertical junctions to be provided in the surface of wafer 13. A plurality of clamps 27 (viz., one at each of the four edges of the mask plate 23-base plate 11 assembly) was used to hold the aligner device 10 in the assembled condition during processing of a wafer 13. Only one such clamp 27 is shown for simplicity of illustration.

The fabrication process for one vertical junction silicon solar cell type utilizing mask aligner 10 may be summarized as follows:

1. provide a wafer 13 of P-type silicon having the (110) crystallographic planes parallel to the surfaces of the wafer;
2. form an oxidized coating on the surfaces of the wafer;
3. coat a surface of the wafer with photoresist;
4. cover the coated surface with a mask 23 defining the desired channel pattern and align the lines 26 of channel pattern 25 parallel to the (111) crystallographic planes and expose;
5. remove the oxide in the channel pattern;
6. remove remaining photoresist;
7. etch the channels to the desired depth using an orientation dependent etchant such as potassium hydroxide solution (nominally 30%);
8. selectively remove the remaining oxide coating from the etched wafer surfaces;
9. form an N-type junction in the entire etched surface area by diffusing a Group V dopant material, such as phosphorous, arsenic, or the like, into the surface of the wafer to the desired depth and clean the wafer surfaces of oxides;
10. apply metallic electrical contacts in the desired configuration on the top and bottom surfaces of the wafer; and
11. apply an antireflective coating of such as an oxide of silicon or tantalum or multilayer coatings of other suitable materials conventionally used therefor.
12. remove the solar cell area from the wafer;

In the fabrication of a solar cell utilizing the mask aligner 10 of the present invention a flat edge 14 of wafer 13 was cleaved, machine, or otherwise accurately cut to provide a reference along a known crystallographic orientation. In the demonstration unit illustrated in the drawing, wafer 13 had a cleave edge 14 perpendicular to the (111) orientation of the silicon wafer 13 so that lines 26 of pattern 25 were aligned precisely along a (111) orientation. Wafer 13 was then placed within the recess 21 defined by wafer pieces 15-18 with edge 14 aligned with edge 19 of piece 18. Mask plate 23 was placed over base plate 11 and wafer 13 and clamped in secure contact with the wafer 13 using clamps 27. The photoresist coating was then exposed through mask plate 23 according to the fabrication procedure for the solar cell comprising wafer 13 presented above. The pattern 25 of mask 23 may be of any desirable design consistent with the predetermined vertical junction configuration for the cell.

The present invention, as hereinabove described, therefore provides a novel mask aligner and method for rapid and accurate alignment of a silicon wafer in the fabrication of a vertical junction solar cell or the like. It is understood that certain modifications to the invention as described may be made as might occur to one with skill in the field of the invention, within the scope of the appended claims. Therefore, all embodiments contemplated hereunder which achieve the objects of the present invention have not been shown in complete detail. Other embodiments may be developed without departing from the spirit of the invention or from the scope of the appended claims.

I claim:

1. In a process for the fabrication of a vertical junction silicon solar cell, an improvement comprising the steps of:
   a. providing a silicon wafer having substantially parallel surfaces along a first predetermined crystallographic plane of said silicon;
   b. cleaving said wafer along a second predetermined crystallographic plane substantially perpendicular to said first plane to provide a straight edge on said wafer of known orientation;
   c. providing a base plate having a recess therein defining an opening for snugly receiving said wafer, said recess including a substantially straight portion for abutment with said cleaved straight edge of said wafer, said recess having a depth slightly less than the thickness of said wafer;
   d. positioning said wafer within said recess with said cleaved straight edge abutting said straight edge of said recess; and
   e. providing a mask plate for covering said base plate and wafer, said mask plate including a pattern thereon in predetermined configuration and orientation through which said wafer may be exposed in said fabrication process for said solar cell.

* * * * *